(12) United States Patent
Akselrod et al.

(10) Patent No.: US 10,763,290 B2
(45) Date of Patent: Sep. 1, 2020

(54) LIDAR SCANNING SYSTEM

(71) Applicant: Elwha LLC, Bellevue, WA (US)

(72) Inventors: Gleb M. Akselrod, Bellevue, WA (US); Erik E. Josberger, Seattle, WA (US); Mark C. Weidman, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 334 days.

(21) Appl. No.: 15/790,337

(22) Filed: Oct. 23, 2017

(65) Prior Publication Data

US 2018/0239021 A1    Aug. 23, 2018

Related U.S. Application Data

(60) Provisional application No. 62/462,105, filed on Feb. 22, 2017.

(51) Int. Cl.
*G01C 3/08* (2006.01)
*H01L 27/146* (2006.01)
(Continued)

(52) U.S. Cl.
CPC .. *H01L 27/14625* (2013.01); *B29D 11/00326* (2013.01); *B82Y 20/00* (2013.01);
(Continued)

(58) Field of Classification Search
CPC .......... G01S 17/89; G01S 17/42; G01S 17/10; G01S 7/4813
(Continued)

(56) References Cited

U.S. PATENT DOCUMENTS 7,969,558 B2  6/2011  Hall
8,767,190 B2  7/2014  Hall
(Continued)

FOREIGN PATENT DOCUMENTS

CN    103259097 A    8/2013

OTHER PUBLICATIONS

Arbabi et al.; "Dielectric metasurfaces for complete control of phase and polarization with subwavelength spatial resolution and high transmission"; Nature Nanotechnology; Aug. 31, 2015; pp. 937-943; vol. 10; Macmillan Publishers Limited.
(Continued)

*Primary Examiner* — Mark Hellner

(57) ABSTRACT

Embodiments include a LIDAR scanning system. A laser is configured to emit pulses of light. A transmit reconfigurable-metasurface is configured to reflect an incident pulse of light as an illumination beam pointing at a field of view. This pointing is responsive to a first holographic beam steering pattern implemented in the transmit reconfigurable-metasurface. A receive reconfigurable-metasurface is configured to reflect a return of the illumination beam to an optical detector. This pointing is responsive to a second holographic beam steering pattern implemented in the receiving reconfigurable-metasurface. An optical detector includes an array of detector pixels. Each detector pixel includes (i) a photodetector configured to detect light in the return of the illumination beam and (ii) a timing circuit configured to determine a time of flight of the detected light. The optical detector is also configured to output a detection signal indicative of the detected light and the time of flight.

40 Claims, 5 Drawing Sheets

(51) Int. Cl.

| | |
|---|---|
| *G02F 1/29* | (2006.01) |
| *G02B 5/18* | (2006.01) |
| *G03H 1/04* | (2006.01) |
| *H04N 5/225* | (2006.01) |
| *H04N 5/374* | (2011.01) |
| *B29D 11/00* | (2006.01) |
| *B82Y 20/00* | (2011.01) |
| *G03H 1/02* | (2006.01) |
| *H01Q 1/38* | (2006.01) |
| *H01Q 3/44* | (2006.01) |
| *H01Q 15/00* | (2006.01) |
| *H01Q 15/02* | (2006.01) |
| *H01Q 15/14* | (2006.01) |
| *G01S 17/89* | (2020.01) |
| *G02F 1/01* | (2006.01) |
| *G02F 1/1339* | (2006.01) |
| *G02F 1/1341* | (2006.01) |
| *G03H 1/00* | (2006.01) |
| *G02F 1/1334* | (2006.01) |
| *G03F 7/20* | (2006.01) |

(52) U.S. Cl.
CPC ............ *G01S 17/89* (2013.01); *G02B 5/1809* (2013.01); *G02F 1/0107* (2013.01); *G02F 1/1339* (2013.01); *G02F 1/1341* (2013.01); *G02F 1/292* (2013.01); *G03H 1/00* (2013.01); *G03H 1/0244* (2013.01); *G03H 1/0443* (2013.01); *H01L 27/14643* (2013.01); *H01Q 1/38* (2013.01); *H01Q 3/44* (2013.01); *H01Q 15/002* (2013.01); *H01Q 15/0066* (2013.01); *H01Q 15/02* (2013.01); *H01Q 15/148* (2013.01); *H04N 5/2253* (2013.01); *H04N 5/374* (2013.01); *G02F 1/13342* (2013.01); *G02F 2202/103* (2013.01); *G02F 2202/30* (2013.01); *G02F 2202/36* (2013.01); *G03F 7/2041* (2013.01); *G03F 7/2059* (2013.01); *G03H 2240/13* (2013.01); *H01J 2237/334* (2013.01)

(58) Field of Classification Search
USPC ........................................................ 356/5.01
See application file for complete search history.

(56) References Cited

U.S. PATENT DOCUMENTS

| | | | |
|---|---|---|---|
| 9,040,428 | B2 | 5/2015 | Hong et al. |
| 9,285,477 | B1 | 3/2016 | Smith et al. |
| 10,303,038 | B2* | 5/2019 | Kim ................. G02F 1/293 |
| 2002/0081445 | A1 | 6/2002 | Kadomura et al. |
| 2003/0174940 | A1 | 9/2003 | Charlton et al. |
| 2004/0125266 | A1 | 7/2004 | Miyauchi et al. |
| 2005/0117866 | A1 | 6/2005 | Park et al. |
| 2006/0202125 | A1 | 9/2006 | Suhami |
| 2006/0284187 | A1 | 12/2006 | Wierer, Jr. et al. |
| 2011/0216304 | A1 | 9/2011 | Hall |
| 2011/0244613 | A1 | 10/2011 | Heck et al. |
| 2012/0194399 | A1 | 8/2012 | Bily et al. |
| 2012/0267694 | A1 | 10/2012 | Kaiser et al. |
| 2014/0038320 | A1 | 2/2014 | Wang |
| 2014/0211194 | A1 | 7/2014 | Pacala et al. |
| 2014/0266946 | A1 | 9/2014 | Bily et al. |
| 2015/0162658 | A1 | 6/2015 | Bowers et al. |
| 2015/0192677 | A1 | 7/2015 | Yu et al. |
| 2015/0293224 | A1 | 10/2015 | Eldada et al. |
| 2015/0318618 | A1 | 11/2015 | Chen et al. |
| 2015/0318620 | A1 | 11/2015 | Black et al. |
| 2015/0372389 | A1 | 12/2015 | Chen et al. |
| 2015/0378241 | A1 | 12/2015 | Eldada |
| 2015/0380828 | A1 | 12/2015 | Black et al. |
| 2016/0047901 | A1 | 2/2016 | Pacala et al. |
| 2016/0049765 | A1 | 2/2016 | Eldada |
| 2016/0161600 | A1 | 6/2016 | Eldada et al. |
| 2017/0047312 | A1 | 2/2017 | Budd et al. |
| 2017/0146640 | A1 | 5/2017 | Hall et al. |
| 2017/0153528 | A1* | 6/2017 | Kim .................. G02F 1/293 |
| 2018/0047774 | A1 | 2/2018 | Garreau et al. |
| 2019/0006533 | A1 | 1/2019 | Goldan et al. |
| 2019/0377084 | A1* | 12/2019 | Sleasman ............... G01S 13/89 |

OTHER PUBLICATIONS

PCT International Search Report; International App. No. PCT/US2018/019269; dated Jun. 4, 2018; pp. 1-4.
PCT International Search Report; International App. No. PCT/US2018/019036; dated Jun. 11, 2018; pp. 1-3.
Arbabi et al.; "Subwavelength-thick lenses with high numerical apertures and large efficiency based on high-contrast transmitarrays"; Nature Communications; May 7, 2015; pp. 1-6; Macmillan Publishers Limited 2015.
Borshch et al.; "Nanosecond Electro-Optic Switching of a Liquid Crystal"; Physical Review Letters; Sep. 6, 2013; pp. 107802-1-107802-5; vol. 111; American Physical Society 2013.
Chen et al.; "Ultra-low viscosity liquid crystal materials"; Optical Materials Express; Feb. 25, 2015; pp. 655-660; vol. 5, No. 3; Optical Society of America 2015.
Gholipour et al.; "An All-Optical, Non-volatile, Bidirectional, Phase-Change Meta-Switch"; Advanced Materials; Apr. 29, 2013 pp. 3050-3054; vol. 25; Wiley-VCH Verlag GmbH & Co. KGaA, Weinheim.
Haffner et al.; "All-plasmonic Mach-Zehnder modulator enabling optical high-speed communication at the microscale"; Nature Photonics; Jul. 27, 2015; pp. 525-529; vol. 9.; Macmillan Publishers Limited 2015.
Li et al.; "Poling efficiency enhancement of tethered binary nonlinear optical chromophores for achieving an ultrahigh n3r33 figure-of-merit of 2601 pm V-1"; Journal of Materials Chemistry C; May 19, 2015; pp. 6737-6744; vol. 3.; The Royal Society of Chemistry 2015.
Fors et al.; "Plasrnonic metasurfaces for efficient phase control in reflection"; Optics Express; Nov. 4, 2013; pp. 1-14; vol. 21, No. 22; Optical Society of America 2013.
Raoux et al.; "Phase change materials and phase change memory"; MRS Bulletin; Aug. 2014; pp. 703-710; vol. 39; Materials Research Society 2014.
Rios et al.; "Integrated all-photonic non-volatile multi-level memory"; Nature Photonics; Sep. 21, 2015; pp. 725-733; vol. 9.; Macmillan Publishers Limited 2015.
Xing et al.; "Digitally Controlled Phase Shifter Using an SOI Slot Waveguide With Liquid Crystal Infiltration"; IEEE Photonics Technology Letters; Jun. 15, 2015; pp. 1269-1272; vol. 27, No. 12; IEEE 2015.
Zhang et al.; "High Performance Optical Modulator Based on Electro-Optic Polymer Filled Silicon Slot Photonic Crystal Waveguide"; Journal of Lightwave Technology; Jun. 15, 2016; pp. 2941-2951; vol. 34, No. 12; IEEE 2015.
Huang et al.; "Gate-tunable conducting oxide metasurfaces"; printed on Oct. 20, 2017; pp. 1-13; USA.
Horaud, et al.; "An Overview of Depth Cameras and Range Scanners Based on Time-of-Flight Technologies"; HAL archives-ouvertes.fr; dated Jun. 1, 2016; pp. 1-18; Machine Vision and Applications.
Aull, Brian; "Geiger-Mode Avalanche Photodiode Arrays Integrated to All-Digital CMOS Circuits"; Sensors; 2016; pp. 1-14; vol. 16,495; mdpi.com/journal/sensors; Switzerland.
Aflatouni et al.; "Nanophotonic coherent imager"; Optics Express; Feb. 19, 2015; pp. 1-9; vol. 23, No. 4; Optical Society of America.

* cited by examiner

FIG. 2
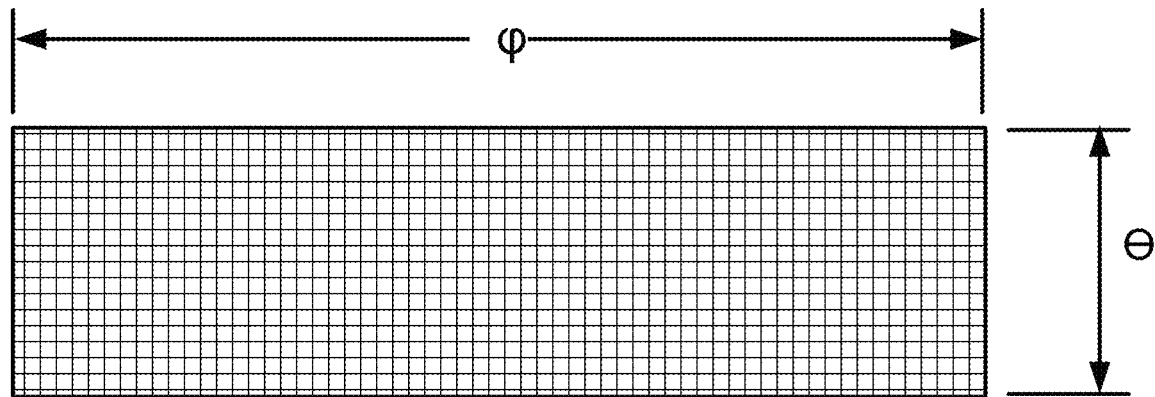
FIG. 2B
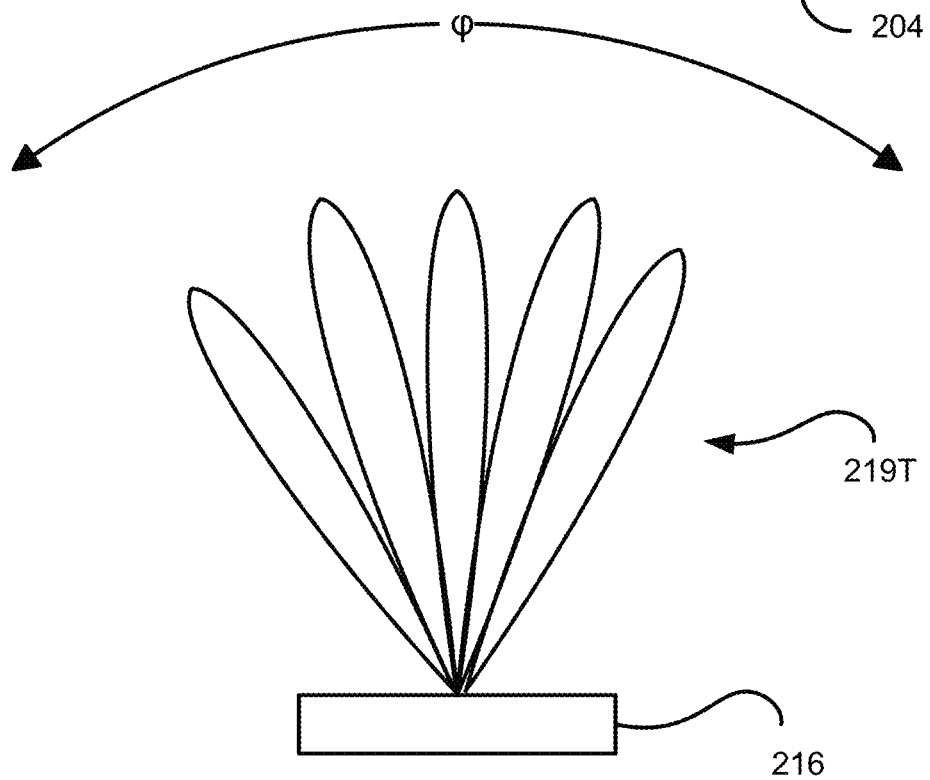
FIG. 2A

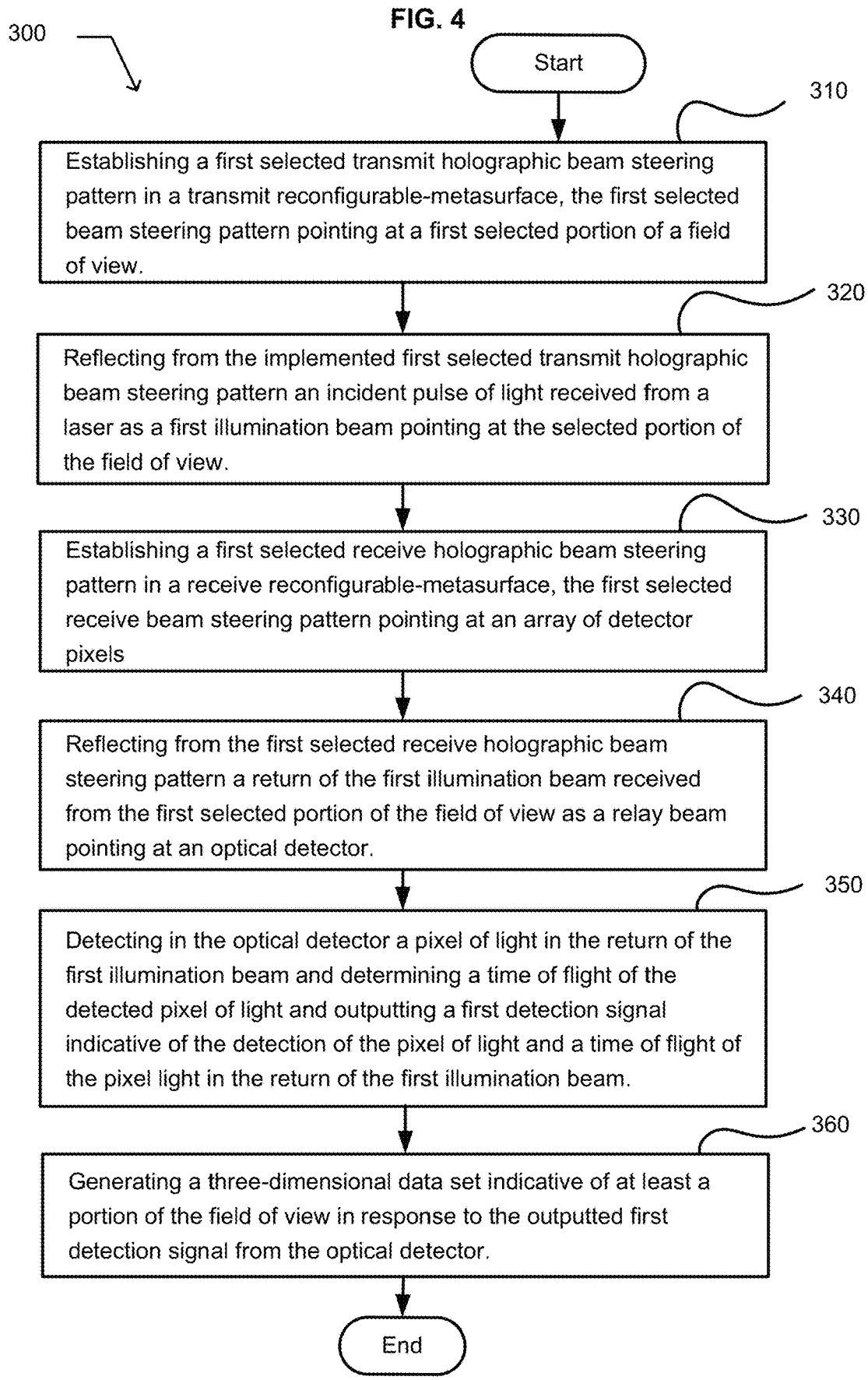

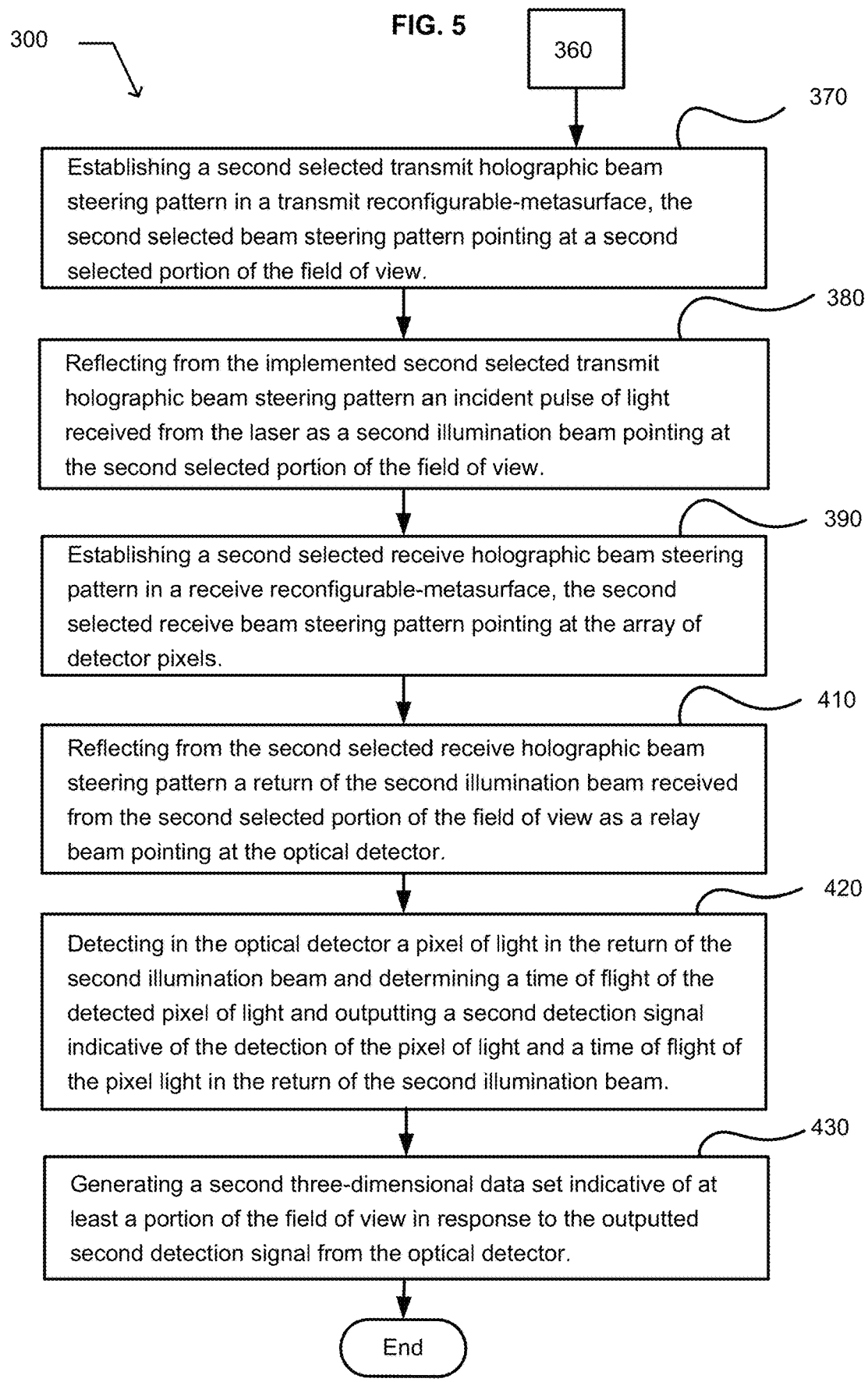

LIDAR SCANNING SYSTEM

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

PRIORITY APPLICATIONS

The present application claims benefit of priority of U.S. Provisional Patent Application No. 62/462,105, entitled OPTICAL SURFACE SCANNING ANTENNAS, naming GLEB M. AKSELROD as inventor, filed 22, Feb., 2017, which was filed within the twelve months preceding the filing date of the present application or is an application of which a currently co-pending priority application is entitled to the benefit of the filing date.

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

For example, and without limitation, an embodiment of the subject matter described herein includes an embodiment of a LIDAR scanning system. The system includes a laser configured to emit pulses of light at an operating wavelength. The system includes a transmit reconfigurable-metasurface configured to reflect an incident pulse of light from the laser as an illumination beam pointing at a selected portion of a field of view. The pointing of the illumination beam is responsive to a first selected holographic beam steering pattern implemented in the transmit reconfigurable-metasurface. The system includes a receive reconfigurable-metasurface configured to reflect a return of the illumination beam from the selected portion of the field of view as a relay beam pointing at an optical detector. The pointing of the relay beam is responsive to a second selected holographic beam steering pattern implemented in the receiving reconfigurable-metasurface. The system includes the optical detector comprising an array of detector pixels. Each detector pixel includes (i) a photodetector configured to detect light in the return of the illumination beam and (ii) a timing circuit configured to determine a time of flight of the detected light. The optical detector is also configured to output a detection signal indicative of the detected light and a time of flight of the detected light for each pixel of the array.

In an embodiment, the system includes a scanning engine configured to implement a scan of the field of view by stepping the transmitted beam of the pulsed light 219T over at least a portion of the field of view. In an embodiment, the system includes a a data computation circuit configured to generate three-dimensional data indicative of at least a portion of the field of view in response to the outputted detection signal from the optical detector.

For example, and without limitation, an embodiment of the subject matter described herein includes another embodiment of a LIDAR scanning system. The system includes a laser configured to emit pulses of light at an operating wavelength. The system includes a transmit reconfigurable-metasurface configured to reflect the incident pulse of light from the laser as an illumination beam pointing at a selected portion of a field of view. The pointing of the illumination beam is responsive to a first selected holographic beam steering pattern implemented in the transmit reconfigurable-metasurface. The system includes the receive reconfigurable-metasurface configured to reflect the return of the illumination beam from the selected portion of the field of view as a relay beam pointing at the optical detector. The pointing of the relay beam is responsive to a second selected holographic beam steering pattern implemented in the receiving reconfigurable-metasurface. The system includes the optical detector comprising an array of detector pixels. Each detector pixel including (i) a photodetector configured to detect light in the return of the illumination beam and (ii) a timing circuit configured to determine a time of flight of the detected light. The optical detector is also configured to output a detection signal indicative of the detected light and a time of flight of the detected light for each pixel of the array. The system includes the scanning engine configured to implement a scan of the field of view by stepping the transmitted beam of the pulsed light over at least a portion of the field of view. The implementation including selecting for each pulse of light to be reflected by the transmit reconfigurable-metasurface (i) a first holographic beam steering pattern to be implemented in the transmit reconfigurable-metasurface and (ii) a second holographic beam steering pattern to be implemented in the receive reconfigurable-metasurface. In an embodiment, the engine includes a metasurface controller circuit configured to implement the selected first holographic beam steering pattern using a first control signal and the selected second holographic beam steering pattern using a second control signal.

For example, and without limitation, an embodiment of the subject matter described herein includes a further embodiment of a LIDAR scanning system. The system includes an optical transmitter configured to reflect an incident pulse of light from a laser as the illumination beam pointing at a selected portion of the field of view. The pointing of the illumination beam is responsive to a first selected holographic beam steering pattern. The scanning system include an optical receiver configured to reflect a return of the illumination beam from the selected portion of the field of view as a relay beam pointing at the optical detector. The pointing of the relay beam is responsive to a second selected holographic beam steering pattern. The scanning system includes the optical detector comprising an array of detector pixels. Each detector pixel is configured to receive the relay beam and includes (i) a photodetector configured to detect light in the return of the illumination beam and (ii) a timing circuit configured to determine a time of flight of the detected light. The optical detector also configured to output a detection signal indicative of the detected light and a time of flight of the detected light for each pixel of the array. The scanning system includes the scanning engine configured to implement a scan of the field of view by stepping the illumination beam over at least a portion of the field of view. The implementation including selecting for each pulse of light to be reflected by the optical transmitter (i) a first holographic beam steering pattern and (ii) a second holographic beam steering pattern.

For example, and without limitation, an embodiment of the subject matter described herein includes a further embodiment of a LIDAR scanning system. The system includes a dynamically reconfigurable-metasurface configured to scan a field of view.

For example, and without limitation, an embodiment of the subject matter described herein includes a method. The method includes example operational flow. After a start operation, the operational flow includes a transmit patterning operation. The transmit patterning operation includes establishing a first selected transmit holographic beam steering pattern in a transmit reconfigurable-metasurface. The first selected beam steering pattern points at a first selected portion of a field of view. In an embodiment, the selected portion of the field of view may be described by ($\varphi \times \theta$) coordinates. A beam transmit operation includes reflecting from the implemented first selected transmit holographic beam steering pattern an incident pulse of light received from a laser as a first illumination beam pointing at the selected portion of the field of view. A receive beam patterning operation includes establishing a first selected receive holographic beam steering pattern in a receive reconfigurable-metasurface. The first selected receive beam steering pattern points at an array of detector pixels. A beam receive operation includes reflecting from the first selected receive holographic beam steering pattern a return of the first illumination beam received from the first selected portion of the field of view as a relay beam pointing at an optical detector. A pixel evaluation operation includes detecting in the optical detector a pixel of light in the return of the first illumination beam and determining a time of flight of the detected pixel of light and outputting a first detection signal indicative of the detection of the pixel of light and a time of flight of the pixel light in the return of the first illumination beam. A mapping operation includes generating a three-dimensional data set indicative of at least a portion of the field of view in response to the outputted first detection signal from the optical detector. In an embodiment, the mapping operation may be implemented using a data computation circuit described in conjunction with FIG. 1. In an embodiment, the operational flow is implemented in a system that does not include any moving parts.

The foregoing summary is illustrative only and is not intended to be in any way limiting. In addition to the illustrative aspects, embodiments, and features described above, further aspects, embodiments, and features will become apparent by reference to the drawings and the following detailed description.

BACKGROUND

Metamaterial surface antenna technology (MSAT) is a recent advancement in reconfigurable antenna technology. Metamaterial surface antennas, also known as surface scattering antennas or metasurface antennas, are described, for example, in U.S. Patent Application Publication No. 2012/0194399 (hereinafter "Bily I"). Surface scattering antennas that include a waveguide coupled to a plurality of subwavelength patch elements are described in U.S. Patent Application Publication No. 2014/0266946 (hereinafter "Bily II"). Surface scattering antennas that include a waveguide coupled to adjustable scattering elements loaded with lumped devices are described in U.S. Application Publication No. 2015/0318618 (hereinafter "Chen I"). Surface scattering antennas that feature a curved surface are described in U.S. Patent Application Publication No. 2015/0318620 (hereinafter "Black I"). Surface scattering antennas that include a waveguide coupled to a plurality of adjustably-loaded slots are described in U.S. Patent Application Publication No. 2015/0380828 (hereinafter "Black II"). And various holographic modulation pattern approaches for surface scattering antennas are described in U.S. Patent Application Publication No. 2015/0372389 (hereinafter "Chen II").

While the above applications are principally focused on waveguide embodiments, where a reference wave or feed wave is delivered to the adjustable scattering elements via a waveguide underlying the scattering elements, in other approaches, the reference wave or feed wave may be a free-space wave that is delivered to the adjustable scattering elements by illuminating from above a reflective surface that is populated with adjustable scattering elements. An example is shown in U.S. Patent Application Publication No. 2015/0162658 (hereinafter "Bowers"). Embodiments of the present invention use a similar free-space feed configuration, with a reflective surface that is illuminated from above, the reflective surface being populated with adjustable scattering elements. It will be appreciated that, throughout this disclosure, whenever an embodiment is disclosed that involves illuminating a surface with a free-space reference wave to provide a reflected outgoing (transmit) wave having a specific field pattern, a reciprocal embodiment is also contemplated that involves reflecting a incoming (receive) wave from the surface and then detecting the reflected wave according to the same specific field pattern.

Furthermore, while the above applications are principally focused on embodiments operable at radio or microwave frequencies, the present invention involves embodiments operable at higher frequencies, especially at infrared or visible frequencies. When operating frequencies are scaled up to optical (infrared/visible) frequencies, the sizes of the individual scattering elements and the spacings between adjacent scattering elements are proportionally scaled down, to preserve the subwavelength/metamaterial aspect of the technology. The relevant length scales for operation at optical frequencies, typically on the order of microns or smaller, are smaller than the typical length scales for conventional PCB processes, so embodiments of the present invention may instead be implemented using micro- and nano-lithographic processes such as CMOS lithography, PECVD, and reactive ion etching.

Finally, while the above applications typically use metallic structures with resonances that are adjustable to provide the adjustable element responses, these metallic structures become increasingly lossy as the operating frequency approaches optical frequencies. These losses are undesirable because they degrade the efficiency of a reconfigurable antenna that is implemented using metallic resonant structures. Embodiments of the present invention mitigate the lossy characteristics of metals at optical frequencies by using primarily dielectric structures having primarily dielectric resonances.

Various applications of an optical surface scattering antenna as described herein include, but are not limited to: imaging via LIDAR; imaging via structured illumination; free-space optical communication, either single-beam or MIMO; and pointing and tracking for free space optical communications.

BRIEF DESCRIPTION OF THE FIGURES

FIG. 2A illustrates an embodiment of the reconfigurable-metasurface scanning the field of view by stepping a transmitted beam of the pulsed light over at least a portion of the field of view;

FIG. 2B illustrates an embodiment of the field of view having $\varphi \times \theta$ dimensions;

FIG. 4 illustrates an example operational flow; and

FIG. 5 illustrates an alternative embodiment of the operational flow.

DETAILED DESCRIPTION

Figure 1:
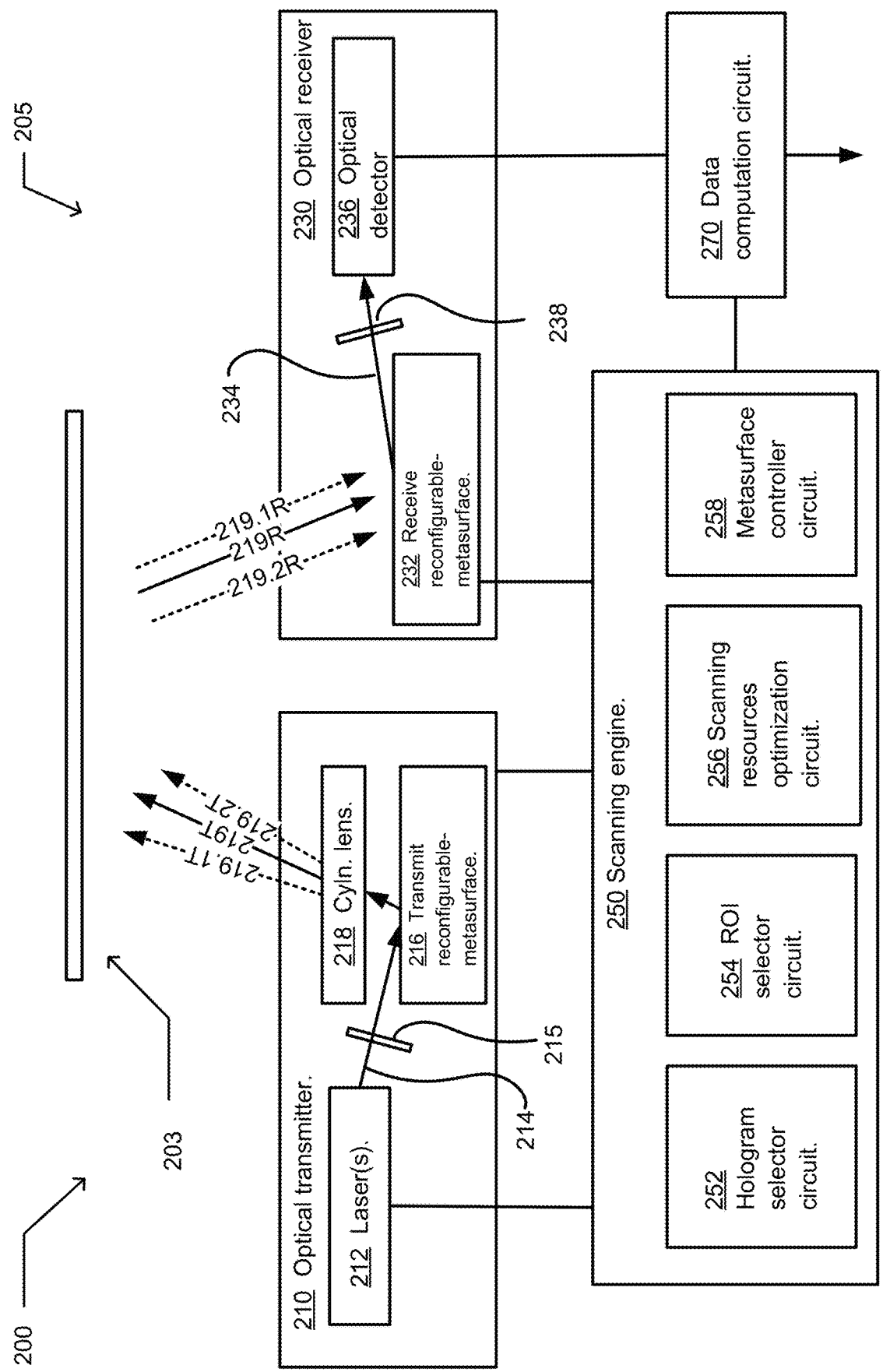
FIG. 1 illustrates an example environment in which embodiments may be implemented.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various implementations by which processes and/or systems and/or other technologies described herein can be effected (e.g., hardware, software, and/or firmware), and that the preferred implementation will vary with the context in which the processes and/or systems and/or other technologies are deployed. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Hence, there are several possible implementations by which the processes and/or devices and/or other technologies described herein may be effected, none of which is inherently superior to the other in that any implementation to be utilized is a choice dependent upon the context in which the implementation will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures suitable to implement an operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components.

Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described below. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those skilled in the art will recognize how to obtain, configure, and optimize suitable transmission or computational elements, material supplies, actuators, or other common structures in light of these teachings.

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, module, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will also recognize that the various aspects described herein which can be implemented, individually and/or collectively, by a wide range of hardware, software, firmware, and/or any combination thereof can be viewed as being composed of various types of "circuitry" or "electrical circuitry." Consequently, as used herein "circuitry" and "electrical circuitry" both include, but are not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Figure 3:
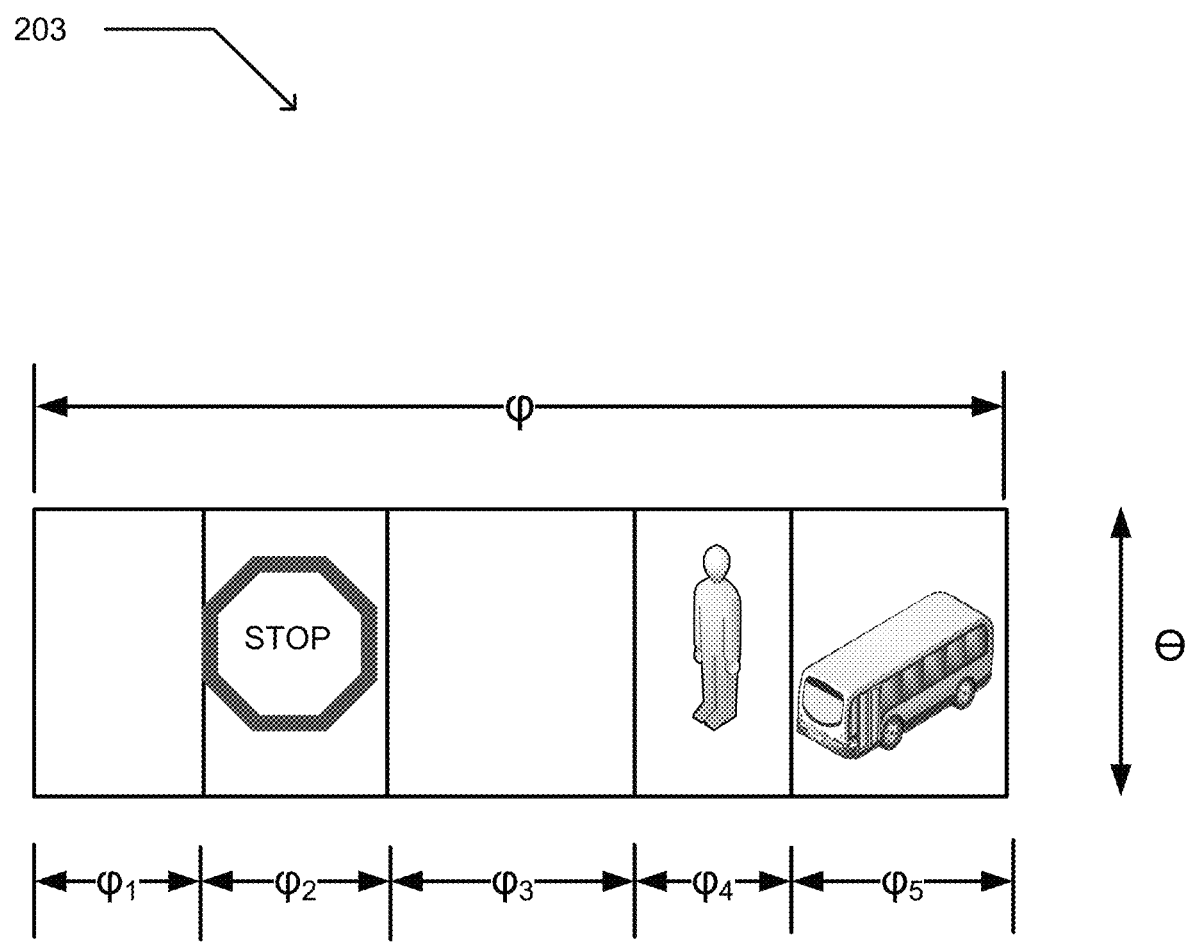
FIG. 3 illustrates an embodiment where the object in the selected portion of the field of view may be a traffic control signal, a human, or a vehicle.

FIGS. 1-3 illustrate an environment 200 in which embodiments may be implemented. FIG. 1 illustrates an embodiment of a LIDAR scanning system 205. The LIDAR scanning system includes a laser 212 configured to emit pulses of light 214 at an operating wavelength. In an embodiment, the laser is configured to emit pulses of collimated light. The LIDAR scanning system includes a transmit reconfigurable-metasurface 216 configured to reflect an incident pulse of light from the laser as an illumination beam 219T pointing at a selected portion of a field of view 203. The pointing of the illumination beam is responsive to a first selected holographic beam steering pattern implemented in the transmit reconfigurable-metasurface. In an embodiment, the field of view includes a two dimensional field of view.

FIG. 2B illustrates an embodiment of the field of view 203 having φ×θ dimensions. In an embodiment, φ represents a horizontal dimension of the field of view. In an embodiment, θ represents a vertical dimension of the field of view. In an embodiment, θ represents a vertical dimension of the field of view. FIG. 2B also illustrates the φ×θ field of view 203 divided into scanning pixels 204. In an embodiment, the field of view includes a field of view of an external environment. For example, an external environment includes an external environment that may be encountered by an autonomous vehicle, such as a car, truck, airplane, or robot. FIG. 2A illustrates an embodiment of the reconfigurable-metasurface 216 scanning the field of view 203 by stepping a transmitted beam 219T of the pulsed light over at least a portion of the field of view.

The LIDAR scanning system 205 includes a receive reconfigurable-metasurface 232 configured to reflect a return of the illumination beam 219R from the selected portion of the field of view as a relay beam 234 pointing at an optical detector 236. The pointing of the relay beam is responsive to a second selected holographic beam steering pattern implemented in the receiving reconfigurable-metasurface. The LIDAR scanning system includes the optical detector comprising an array of detector pixels. Each detector pixel includes (i) a photodetector configured to detect light in the return of the illumination beam and (ii) a timing circuit configured to determine a time of flight of the detected light. The optical detector is also configured to output a detection signal indicative of the detected light and a time of flight of the detected light for each pixel of the array.

In an embodiment, a pixel is a physical point in an image, a data point in a sampled or imaged space, or the smallest addressable element addressable by a device. In an embodiment, a pixel is the smallest controllable element of an image represented on the screen. In an embodiment, a pixel is a basic unit of an image. In an embodiment, a pixel is the smallest element of an image that can be individually processed. In an embodiment, a pixel is a sampled unit of space. In an embodiment, the pixel is a sampled unit of space on a grid.

In an embodiment, the laser 212 is configured to controllably emit pulses of light. In an embodiment, the laser is configured to emit pulses of light at an operating wavelength. In an embodiment, the laser operating wavelength is 840, 905, or 1550 nm. In an embodiment, the laser operating wavelength is between 650 and 1700 nm. In an embodiment, the laser includes a collimating lens 215.

In an embodiment, the φ of the field of view 203 is between 90 and 120 degrees. In an embodiment, the φ of the field of view is a horizon view range. For example, in an embodiment, the φ of the field of view may be 120 degrees. In an embodiment, three 120 degree transmit reconfigurable-metasurfaces 216 may be assembled in a triangular arrangement to scan the full 360 degrees the field of view of the external environment. In an embodiment, three 120 degree transmit reconfigurable-metasurfaces may be assembled into a single structure, or may simply be at a single location. In an embodiment, three 120 degree transmit reconfigurable-metasurfaces may be spaced apart, such as separate spaced apart locations around a car. In an embodiment, four transmit reconfigurable-metasurfaces may be assembled in a triangular arrangement to scan the full 360 degrees the field of view of the external environment. In an embodiment, three or more of the receive reconfigurable-metasurfaces 232 may be assembled to receive a return of the illumination beam 219R over a full 360 degrees of the field of view of the external environment. In an embodiment, the θ of the field of view is a vertical view range. In an embodiment, the θ of the field of view 203 is between 5 and 25 degrees. For example, in an embodiment, the θ of the field of view may be 20 degrees. In an embodiment, the field of view includes a field of view of an external environment. In an embodiment, the field of view includes a field of view of a dynamic external environment. For example, a dynamic external environment may that encountered by a car driving through traffic or an airplane landing. For example, a dynamic external environment may include that encountered by an autonomous vehicle, such as a car, truck, airplane, or robot.

In an embodiment, the transmit reconfigurable-metasurface 216 includes a dynamically reconfigurable-metasurface. In an embodiment, the dynamically reconfigurable-metasurface includes a metasurface configured to implement a constant or continuous change in the φ or θ pointing of the illumination beam 219T. In an embodiment, the pointing of the transmit reconfigurable-metasurface is reconfigurable in less than 10 microseconds. In an embodiment, the pointing of the transmit reconfigurable-metasurface is reconfigurable on a time scale of between 1 microsecond and 1000 microseconds. In an embodiment, the transmit reconfigurable-metasurface includes a one-dimensional reconfigurable-metasurface. In an embodiment, the transmit reconfigurable-metasurface includes a two-dimensional reconfigurable-metasurface. In an embodiment, the transmit reconfigurable-metasurface includes a plurality of dynamically adjustable high-Q dielectric resonators arranged on a surface of the reconfigurable-metasurface with inter-element spacing less than the operating wavelength of the laser. In an embodiment, high-Q is a Q greater than 5. In an embodiment, high-Q is a Q greater than 5 and less than 100. A high Q indicates that modest changes in a dielectric constant can be used to substantially shift the resonant wavelength of each resonator. Assuming a fixed frequency of operation near the resonance of the resonator, the scattered field from the resonator will vary in phase and amplitude as a function of the tuned dielectric value; although the phase and amplitude are correlated through the Lorentzian resonance, the phase of the field over the aperture is typically important (in holographic or beam-forming designs), and considerable control can be accomplished without additionally introduced phase-shifters.

In an embodiment, the surface of the reconfigurable-metasurface includes a conducting surface, and the plurality of resonators have a corresponding plurality of adjustable reflection phases providing a dynamically adjustable reflected wave responsive to an incident wave. In an embodiment, the conducting surface and the plurality of resonators define a metasurface. In an embodiment, the inter-element spacing is less than one-half of the operating wavelength. In an embodiment, the inter-element spacing is less than one-third of the operating wavelength. In an embodiment, the inter-element spacing is less than one-fourth of the operating wavelength. In an embodiment, the inter-element spacing is less than one-fifth of the operating wavelength. In an embodiment, the operating wavelength is a visible wavelength. In an embodiment, the operating wavelength is an infrared wavelength. For example, an infrared wavelength may include a near-infrared wavelength, short-infrared wavelength, medium-infrared wavelength, a long-infrared wavelength, or far-infrared wavelength. In an embodiment, the infrared operating wavelength is a telecommunications band wavelength. In an embodiment, each of the plurality of dielectric resonators includes (i) a pair of regions having high refractive index; and (ii) an electrically-adjustable material disposed in a gap between the regions. In an embodiment, a high refractive index includes a refractive index between 3 and 4. In an embodiment, the regions include semiconductor regions. In an embodiment, the semiconductor regions include Si, Ge, or GaAs semiconductor regions. In an embodiment, the regions include pillars oriented perpendicular to the surface. In an embodiment, the electrically-adjustable material is an electro-optical polymer material. In an embodiment, the electrically-adjustable material is a liquid crystal material. In an embodiment, the electrically-adjustable material is a chalcogenide glass material. In an embodiment, the electrically-adjustable material is a silicon. In an embodiment, each of the plurality of resonators further includes a pair of electrodes configured to apply an adjustable voltage across the electrically-adjustable material. In an embodiment, the plurality of resonators are arranged in a one-dimensional array, and each of the resonators further includes (i) a first electrode in the pair of electrodes is connected to ground and (ii) a second electrode in the pair of electrodes is connected to a bias voltage for the resonator. In an embodiment, the plurality of resonators is arranged in a two-dimensional array indexed by row and column, and each of the resonators further includes a matrix circuitry indexed by row and column and connected to the pair of electrodes. In an embodiment, the matrix circuitry includes a passive matrix addressing circuitry. In an embodiment, the matrix circuitry includes an active matrix addressing circuitry.

In an embodiment, the selected portion of the field of view 203 includes one selected field-of-view pixel 204. For example, a field of view pixel may have between 36 and 3600 arc seconds of the field of view. For example, a field of view pixel may have between 0.01 and 1 degrees of the field of view. In an embodiment, the selected portion of the field of view includes a selected 1×4 field-of-view pixels (Δθ). In an embodiment, the selected portion of the field of view includes a selected 1×8 field-of-view pixels. In an embodiment, the selected portion of the field of view includes a selected 1×16, a 1×32, or a 1×64 field-of-view pixels. In an embodiment, the selected portion of the field of view includes a selected 2×2 field-of-view pixels (Δφ and Δθ). In an embodiment, the selected portion of the field of view includes a selected 4×4 field-of-view pixels. In an embodiment, the selected portion of the field of view includes a selected 8×8 field-of-view pixels. In an embodiment, the selected portion of the field of view includes a selected 8×16, an 8×32, or an 8×64 field-of-view pixels.

In an embodiment, the illumination beam 219T includes a formed illumination beam pointing at a selected portion of the field of view 203. In an embodiment, the illumination beam points in a direction of the selected portion of the field of view.

In an embodiment of the transmit reconfigurable-metasurface 216, the first selected holographic beam steering pattern is implemented in the transmit reconfigurable-metasurface in response to a first control signal. For example, the first control signal may be provided by a metasurface controller 258. In an embodiment, the first transmit reconfigurable-metasurface is reconfigurable in one-dimension (Δφ or Δθ)). In an embodiment, the pointing of the first transmit reconfigurable-metasurface is reconfigurable in two-dimensions (Δφ and Δθ). In an embodiment, the transmit reconfigurable-metasurface is configured to implement at least two selectable holographic beam steering patterns. In an embodiment, the at least two selectable holographic beam steering patterns include at least two selectable arbitrary holographic beam steering patterns.

In an embodiment, the system 205 includes a cylindrical lens 218 configured to spread the emitted pulsed light of the laser over at least a portion of the θ axis of the field of view, illustrated as illumination beams 219.1T, 219T, and 219.2T. In an embodiment, the cylindrical lens includes a cylindrical diffraction lens. In an embodiment, the laser 212 includes at least two lasers arranged to spread the pulse of light 214 over the transmit reconfigurable-metasurface spread and correspondingly spread the illumination beam along at least a portion of the θ axis of the field of view.

In an embodiment, the system 205 includes a transmit-positioning structure configured to maintain a spatial relationship between the laser 212 and the transmit reconfigurable-metasurface 216. The spatial relationship creating a free-space feed configuration with the emitted pulses light incident on the transmit reconfigurable-metasurface. In an embodiment, the spatial relationship creating a free-space feed configuration with the emitted pulses light incident on the transmit reconfigurable-metasurface at a first incident angle.

In an embodiment, the transmit reconfigurable-metasurface 216 includes a first portion of a single reconfigurable-metasurface and the receiving reconfigurable-metasurface 232 includes a second portion of the reconfigurable-metasurface. In an embodiment, the transmit reconfigurable-metasurface is a separate physical structure from the receiving reconfigurable-metasurface. For example, in an embodiment, the transmit reconfigurable-metasurface and receiving reconfigurable-metasurface are physically separate structures arranged side by side or in a proximity. For example, in an embodiment, the transmit reconfigurable-metasurface and receiving reconfigurable-metasurface are physically separate structures arranged side by side, for example edge-to-edge, or spaced apart.

In an embodiment, the receive reconfigurable-metasurface 232 includes a receive reconfigurable-metasurface configured to reflect a return of the illumination beam 219 from the selected portion of the field of view as a formed relay beam 234 pointing at the optical detector 236. In an embodiment, the receive reconfigurable-metasurface includes a dynamically reconfigurable-metasurface. In an embodiment, the receive reconfigurable-metasurface includes a one-dimensional reconfigurable-metasurface. In an embodiment, the receive reconfigurable-metasurface includes a two-dimensional reconfigurable-metasurface. In an embodiment, the receive reconfigurable-metasurface includes a plurality of dynamically adjustable high-Q dielectric resonators arranged on a surface with inter-element spacing less than an optical operating wavelength of the laser. In an embodiment, a high-Q dielectric resonator has a Q greater than 5. In an embodiment, a high-Q dielectric resonator has a Q between 5 and 100.

In an embodiment of the receive reconfigurable-metasurface 232, the reflect a return of the illumination beam includes a reflect a return of the illumination beam of the pulsed light from an object in the selected portion of the field of view. FIG. 3 illustrates an embodiment where the object in the selected portion of the field of view may be a traffic control signal, illustrated by the stop sign in region $\varphi_2$, a human, illustrated by the human shape in region $\varphi_4$, or a vehicle, illustrated by the bus in region $\varphi_5$. In an embodiment, the reflect a return of the illumination beam includes reflectively transmitting the return of the illumination beam as a transit beam 234 pointing at the optical detector 236. In an embodiment, the receive reconfigurable-metasurface includes a two dimensional field of view. In an embodiment, the receive reconfigurable-metasurface is configured to implement a specified beam steering hologram defined by a one-dimensional radiation pattern established in the receive reconfigurable-metasurface in response to a second control signal. In an embodiment, the receive reconfigurable-metasurface is configured to implement at least two selectable holographic beam steering patterns in response to a second control signal. In an embodiment, the receive reconfigurable-metasurface is configured to implement at least two selectable arbitrary holographic beam steering patterns in response to a second control signal.

In an embodiment, the system 205 includes a collimating lens configured to collimate the relay beam 234 pointing at the optical detector 236. In an embodiment, the system includes a spherical lens 238 configured to focus the relay beam on the optical detector. In an embodiment, the system includes a reception-positioning structure configured to maintain a spatial relationship between the receive reconfigurable-metasurface 232 and the optical detector circuit 236. In an embodiment, the spatial relationship creating a free-space feed configuration with the relay beam 234 incident on the optical detector. In an embodiment, the spatial relationship creating a free-space feed configuration with the relay beam incident on the optical detector at a second incident angle.

In an embodiment of the optical detector circuit 236, at least one pixel of the array of detector pixels has a resolution between 36 and 3600 arc seconds. In an embodiment of the optical detector circuit, at least one pixel of the array of detector pixels has a resolution between 0.01 to 1 degrees. In an embodiment, the array of detector pixels is a single detector pixel. In an embodiment, the array of detector pixels includes one or more detector pixels. In an embodiment, the array of detector pixels includes a 1×4 array of detector pixels. (Δθ) In an embodiment, the density or resolution of the pixels in the array of detector pixels may or may not correspond to a density or resolution of the field-of-view pixels 204. In an embodiment, the array of detector pixels includes a 1×8, 1×16, 31×2, or 1×64 array of detector pixels. In an embodiment, the array of detector pixels includes a 2×2 array of detector pixels. (Δφ and Δθ) In an embodiment, the array of detector pixels includes a 4×4 array of detector pixels. In an embodiment, the array of detector pixels includes a 8×8, 8×16, 8×32, or 8×64 array of detector pixels.

In an embodiment of the optical detector circuit 236, the timing circuit of a pixel includes a timing circuit configured to determine a time of flight between a transmission of the pulse of light and a detection of the light of the return of the illumination beam. In an embodiment, at least one detector pixel of the array of detector pixels further includes an amplifier operably coupled with the photodetector. In an embodiment, the photodetector includes an avalanche diode photodetector. For example, the avalanche diode photodetector may include a single photon avalanche diode.

In an embodiment, the system 205 includes a scanning engine 250 configured to implement a scan of the field of view 203 by stepping the transmitted beam of the pulsed light 219T over at least a portion of the field of view. The implementation including selecting for each pulse of light to be reflected by the transmit reconfigurable-metasurface 216 (i) a first holographic beam steering pattern to be implemented in the transmit reconfigurable-metasurface and (ii) a second holographic beam steering pattern to be implemented in the receive reconfigurable-metasurface 232. In an embodiment, the scanning engine is configured to implement a scan of the field of view by incrementally stepping the transmitted beam of the pulsed light over at least a portion of the field of view. In an embodiment, the scanning engine is configured to implement a scan of the field of view by stepping the transmitted beam of the pulsed light over at least a portion of the field of view in an arbitrary pattern. In an embodiment, the scanning engine is configured to implement a scan of the field of view by sequential stepping the transmitted beam of the pulsed light over at least a portion of the field of view. In an embodiment, the scanning engine is configured to control a scan of the field of view by incrementally stepping the pointing of the illumination beam of the pulsed light over the field of view. In an embodiment, the scanning engine is configured to control a scan of the field of view by incrementally stepping the pointing of the illumination beam of the pulsed light over the field of view at a selected resolution. In an embodiment, the scanning engine is configured to control a scan of the field of view by incrementally stepping the pointing of the illumination beam of the pulsed light over the field of view using dynamically selected resolutions. For example, with reference to FIG. 3, a dynamically selected resolution may vary over the field of view. An example of this would be dynamically selecting an enhanced resolution to scan regions $\varphi_2$, $\varphi_4$, and $\varphi_5$. In an embodiment, the scanning engine is configured to control a continuous scan of the field of view. In an embodiment, the scanning engine is configured to control a scan of the field of view at a first resolution. In an embodiment, the scanning engine is configured to control a scan of the field of view at a second resolution, the second resolution selected by the scanning engine in response to the outputted detection signal from the scan at the first resolution. For example, the second resolution may be an increased or decreased resolution with respect to the first resolution. In an embodiment, the scanning engine is configured to control a scan of the field of view at scan rate not less than 10,000 data points (scanning pixels) per second. In an embodiment, the scanning engine circuit is configured to control a scan of the field of view at scan rate not less than 100,000 data points (scanning pixels) per second. In an embodiment, the scan rate is between 100K and 500K data points (scanning pixels) per second. In an embodiment, the scan rate is between 500K and 1M data points (scanning pixels) per second.

In an embodiment, the scanning engine 250 includes a metasurface controller circuit 258 configured to implement the selected first holographic beam steering pattern using a first control signal and the selected second holographic beam steering pattern using a second control signal. In an embodiment, the scanning engine includes a hologram selector circuit 252. The hologram circuit is configured to select (i) a first holographic beam steering pattern configured to reflect the light pulse 214 as the illumination beam 219T pointing at the selected portion of a field of view 203 and (ii) a second holographic beam steering pattern configured to reflect the return of the illumination beam 219R as the relay beam 234 pointing at the optical detector 236. In an embodiment, the holographic beam steering patterns are selected from a library of holographic beam steering patterns. In an embodiment, the holographic beam steering patterns are computed on the fly.

In an embodiment, the scanning engine 250 includes a region of interest selector circuit 254. The region of interest selector circuit is configured to recognize a pattern in a first outputted detection signal produced by a first scan of the field of view 203 at a first resolution. The region of interest selector circuit is also configured to select in response to the recognized pattern a region of interest in the field of view for a second scan at a second resolution higher than the first resolution. For example, in an embodiment, the region of interest selector may run a pattern recognition program that finds a pattern in the outputted detection signal indicative of or suggestive of an object or person of interest in a particular region of the field of view, and then focus on that particular region with a second higher resolution scan. In an embodiment, the select a region of interest includes select a region of interest based upon a recognition of the pattern in the first outputted detection signal as indicative of an object of interest based upon a selection criteria. For example, a selected region of interest may include recognition of a pattern or signature possibly indicative of a close object, a moving object, a vehicle, a traffic control sign, or a human. In an embodiment, the scanning engine is further configured to implement second incremental scan of the field of view at a second resolution that is higher than the first resolution.

In an embodiment, the scanning engine 250 includes a scanning resources optimization circuit 256 configured to select a scanning resolution of the field of view 203. The resolution selection responsive to at least one of a capacity of the transmit reconfigurable-metasurface 216, a capacity of the receiving reconfigurable-metasurface 232, a capacity of the optical detector circuit 236, a power consumption of the scanning system 205, and a quality of the outputted detection signal.

In an embodiment, the system 205 does not include any moving parts. In an embodiment, the system does not include any mechanically moving parts. In an embodiment, the elements of the system are static with respect to each other.

In an embodiment, the system 205 includes a data computation circuit 270 configured to generate three-dimensional data indicative of at least a portion of the field of view 203 in response to the outputted detection signal from the optical detector 236. In an embodiment, the data computation circuit is configured to generate three-dimensional digital data indicative of at least a portion of the field of view in response to the outputted detection signal from the optical detector. In an embodiment, the data computation circuit is configured to generate three-dimensional analog data indicative of at least a portion of the field of view in response to the outputted detection signal from the optical detector. In an embodiment, the data computation circuit is further configured to output a signal indicative of the three-dimensional data.

FIGS. 3-5 illustrate an environment 200 in which another embodiment of the LIDAR scanning system 205 may be implemented. The scanning system includes the laser 212 configured to emit pulses of light at an operating wavelength. The scanning system includes the transmit reconfigurable-metasurface 216 configured to reflect the incident pulse of light 214 from the laser as an illumination beam 219T pointing at a selected portion of a field of view 203. The pointing of the illumination beam is responsive to a first selected holographic beam steering pattern implemented in the transmit reconfigurable-metasurface. The scanning system includes the receive reconfigurable-metasurface 232 configured to reflect the return of the illumination beam 219R from the selected portion of the field of view as a relay beam pointing at the optical detector 236. The pointing of the relay beam is responsive to a second selected holographic beam steering pattern implemented in the receiving reconfigurable-metasurface. The scanning system includes the optical detector comprising an array of detector pixels. Each detector pixel including (i) a photodetector configured to detect light in the return of the illumination beam and (ii) a timing circuit configured to determine a time of flight of the detected light. The optical detector is also configured to output a detection signal indicative of the detected light and a time of flight of the detected light for each pixel of the array. The scanning system includes the scanning engine 250 configured to implement a scan of the field of view by stepping the transmitted beam of the pulsed light over at least a portion of the field of view. The implementation including selecting for each pulse of light to be reflected by the transmit reconfigurable-metasurface (i) a first holographic beam steering pattern to be implemented in the transmit reconfigurable-metasurface and (ii) a second holographic beam steering pattern to be implemented in the receive reconfigurable-metasurface. In an embodiment, the scanning engine includes a metasurface controller circuit 258 configured to implement the selected first holographic beam steering pattern using a first control signal and the selected second holographic beam steering pattern using a second control signal.

FIGS. 3-5 illustrate an environment 200 in which another embodiment of the LIDAR scanning system 205 may be implemented. The scanning system include an optical transmitter 210 configured to reflect an incident pulse of light 214 from a laser as the illumination beam 219T pointing at a selected portion of the field of view 203. The pointing of the illumination beam is responsive to a first selected holographic beam steering pattern. The scanning system include an optical receiver 230 configured to reflect a return of the illumination beam 219R from the selected portion of the field of view as a relay beam 234 pointing at the optical detector 236. The pointing of the relay beam is responsive to a second selected holographic beam steering pattern. The scanning system includes the optical detector 236 comprising an array of detector pixels. Each detector pixel is configured to receive the relay beam and includes (i) a photodetector configured to detect light in the return of the illumination beam and (ii) a timing circuit configured to determine a time of flight of the detected light. The optical detector also configured to output a detection signal indicative of the detected light and a time of flight of the detected light for each pixel of the array. The scanning system includes the scanning engine 250 configured to implement a scan of the field of view by stepping the illumination beam over at least a portion of the field of view. The implementation including selecting for each pulse of light to be reflected by the optical transmitter (i) a first holographic beam steering pattern and (ii) a second holographic beam steering pattern.

In an embodiment of the scanning system 205, the first selected holographic beam steering pattern is implemented in the transmit reconfigurable-metasurface 216. In an embodiment of the scanning system, the second selected holographic beam steering pattern is implemented in a receive reconfigurable-metasurface 236. In an embodiment of the scanning system, the scanning engine 250 includes a hologram selector circuit 252. In an embodiment of the scanning system, the scanning engine includes a region of interest selector circuit 254. In an embodiment of the scanning system, the scanning engine includes a scanning resources optimization circuit 256. In an embodiment of the scanning system, the scanning engine includes a metasurface controller circuit 258. In an embodiment, the scanning system includes a data computation circuit 270 configured to generate three-dimensional data indicative of at least a portion of the field of view in response to the outputted detection signal from the optical detector.

FIGS. 3-5 illustrate an environment 200 in which a further embodiment of the LIDAR scanning system 205 may be implemented. The scanning system includes a dynamically reconfigurable-metasurface configured to scan the field of view 203. In an embodiment, a dynamically reconfigurable-metasurface includes metasurface that is constantly or continuously reconfigurable to scan the field of view. An embodiment of the dynamically reconfigurable-metasurface is illustrated by the transmit reconfigurable-metasurface 216 and/or the receive reconfigurable-metasurface 232. FIG. 2A illustrates an embodiment of the dynamically reconfigurable-metasurface 216 scanning the field of view by stepping a transmitted beam of the pulsed light 219T over at least a portion of the field of view. FIG. 2B illustrates the φ×θ field of view divided into scanning pixels 204. In an embodiment, the LIDAR scanning system may include one or more of the following elements: the laser 212 configured to emit pulses of light at an operating wavelength; the transmit reconfigurable-metasurface 216 configured to reflect an incident pulse of light from the laser as a illumination beam 219T pointing at a selected portion of the field of view, the pointing of the illumination beam responsive to a first selected holographic beam steering pattern implemented in the transmit reconfigurable-metasurface; the receive reconfigurable-metasurface 232 configured to reflect a return of the illumination beam 219R from the selected portion of the field of view as a relay beam pointing 234 at the optical detector 236, the pointing of relay beam responsive to a second selected holographic beam steering pattern implemented in the receiving reconfigurable-metasurface; the optical detector comprising an array of detector pixels, each detector pixel including (i) a photodetector configured to detect light in the return of the illumination beam and (ii) a timing circuit configured to determine a time of flight of the detected light, the optical detector also configured to output a detection signal indicative of the detected light and a time of flight of the detected light for each pixel of the array.

FIG. 4 illustrates an example operational flow 300. After a start operation, the operational flow includes a transmit patterning operation 310. The transmit patterning operation includes establishing a first selected transmit holographic beam steering pattern in a transmit reconfigurable-metasurface. The first selected beam steering pattern points at a first selected portion of a field of view. In an embodiment, the selected portion of the field of view may be described by (φ×θ) coordinates. In an embodiment, the transmit patterning operation may be implemented using the transmit reconfigurable-metasurface 216 and the scanning engine 250 described in conjunction with FIG. 1. A beam transmit operation 320 includes reflecting from the implemented first selected transmit holographic beam steering pattern an incident pulse of light received from a laser as a first illumination beam pointing at the selected portion of the field of view. In an embodiment, the beam transmit operation may be implemented using the laser 212 and the transmit reconfigurable-metasurface 216 described in conjunction with FIG. 1. A receive beam patterning operation 330 includes establishing a first selected receive holographic beam steering pattern in a receive reconfigurable-metasurface. The first selected receive beam steering pattern points at an array of detector pixels. In an embodiment, the receive beam patterning operation may be implemented using the receive reconfigurable-metasurface 232 and the scanning engine 250 described in conjunction with FIG. 1. A beam receive operation 340 includes reflecting from the first selected receive holographic beam steering pattern a return of the first illumination beam received from the first selected portion of the field of view as a relay beam pointing at an optical detector. In an embodiment, the beam receive operation may be implemented using the receive reconfigurable-metasurface 232 and the optical detector 230 described in conjunction with FIG. 1. A pixel evaluation operation 350 includes detecting in the optical detector a pixel of light in the return of the first illumination beam and determining a time of flight of the detected pixel of light and outputting a first detection signal indicative of the detection of the pixel of light and a time of flight of the pixel light in the return of the first illumination beam. In an embodiment, the pixel evaluation operation may be implemented using the optical detector circuit 236 described in conjunction with FIG. 1. A mapping operation 360 includes generating a three-dimensional data set indicative of at least a portion of the field of view in response to the outputted first detection signal from the optical detector. In an embodiment, the mapping operation may be implemented using the data computation circuit 270 described in conjunction with FIG. 1. The operational flow includes an end operation. In an embodiment, the operational flow is implemented in a system that does not include any moving parts.

FIG. 5 illustrates an alternative embodiment of the operational flow 300. A second transmit patterning operation 370 includes establishing a second selected transmit holographic beam steering pattern in a transmit reconfigurable-metasurface, the second selected beam steering pattern pointing at a second selected portion of the field of view. In an embodiment, the second transmit patterning operation may be implemented using the transmit reconfigurable-metasurface 216 and the scanning engine 250 described in conjunction with FIG. 1. A second beam transmit operation 380 includes reflecting from the implemented second selected transmit holographic beam steering pattern an incident pulse of light received from the laser as a second illumination beam pointing at the second selected portion of the field of view. In an embodiment, the second beam transmit operation may be implemented using the laser 212 and the transmit reconfigurable-metasurface 216 described in conjunction with FIG. 1. A second receive beam patterning operation 390 includes establishing a second selected receive holographic beam steering pattern in a receive reconfigurable-metasurface, the second selected receive beam steering pattern pointing at the array of detector pixels. In an embodiment, the second receive beam patterning operation may be implemented using the receive reconfigurable-metasurface 232 and the scanning engine 250 described in conjunction with FIG. 1. A second beam receive operation 410 includes reflecting from the second selected receive holographic beam steering pattern a return of the second illumination beam received from the second selected portion of the field of view as a relay beam pointing at the optical detector. In an embodiment, the second beam receive operation may be implemented using the receive reconfigurable-metasurface 232 and the optical detector 230 described in conjunction with FIG. 1. A second pixel evaluation operation 420 includes detecting in the optical detector a pixel of light in the return of the second illumination beam and determining a time of flight of the detected pixel of light and outputting a second detection signal indicative of the detection of the pixel of light and a time of flight of the pixel light in the return of the second illumination beam. In an embodiment, the second pixel evaluation operation may be implemented using the optical detector circuit 236 described in conjunction with FIG. 1. A second mapping operation 430 includes generating a second three-dimensional data set indicative of at least a portion of the field of view in response to the outputted first detection signal from the optical detector. In an embodiment, the mapping operation may be implemented using the data computation circuit 270 described in conjunction with FIG. 1.

All references cited herein are hereby incorporated by reference in their entirety or to the extent their subject matter is not otherwise inconsistent herewith.

In some embodiments, "configured" includes at least one of designed, set up, shaped, implemented, constructed, or adapted for at least one of a particular purpose, application, or function.

It will be understood that, in general, terms used herein, and especially in the appended claims, are generally intended as "open" terms. For example, the term "including" should be interpreted as "including but not limited to." For example, the term "having" should be interpreted as "having at least." For example, the term "has" should be interpreted as "having at least." For example, the term "includes" should be interpreted as "includes but is not limited to," etc. It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to one skilled in the art. The various aspects and embodiments disclosed herein are for purposes of illustration and are not intended to be limiting, with the true scope and spirit being indicated by the following claims.

The invention claimed is:

1. A LIDAR scanning system comprising:
a laser configured to emit pulses of light at an operating wavelength;
a transmit reconfigurable-metasurface configured to reflect an incident pulse of light from the laser as an illumination beam pointing at a selected portion of a field of view ($\varphi \times \theta$), the pointing of the illumination beam responsive to a first selected holographic beam steering pattern implemented in the transmit reconfigurable-metasurface;
a receive reconfigurable-metasurface configured to reflect a return of the illumination beam from the selected portion of the field of view as a relay beam pointing at an optical detector, the pointing of the relay beam responsive to a second selected holographic beam steering pattern implemented in the receiving reconfigurable-metasurface; and
the optical detector comprising an array of detector pixels, each detector pixel including (i) a photodetector configured to detect light in the return of the illumination beam and (ii) a timing circuit configured to determine a time of flight of the detected light, the optical detector also configured to output a detection signal indicative of the detected light and a time of flight of the detected light for each pixel of the array.

2. The system of claim 1, wherein the $\varphi$ of the field of view is between 90 and 120 degrees.

3. The system of claim 1, wherein the $\theta$ of the field of view is between 5 and 25 degrees.

4. The system of claim 1, wherein the transmit reconfigurable-metasurface includes a dynamically reconfigurable-metasurface.

5. The system of claim 1, wherein the pointing of the transmit reconfigurable-metasurface is reconfigurable on a time scale of less than 10 microseconds.

6. The system of claim 1, wherein the pointing of the transmit reconfigurable-metasurface is reconfigurable on a time scale of between 1 microsecond and 1000 microseconds.

7. The system of claim 1, wherein the transmit reconfigurable-metasurface includes a one-dimensional reconfigurable-metasurface.

8. The system of claim 1, wherein the transmit reconfigurable-metasurface includes a two-dimensional reconfigurable-metasurface.

9. The system of claim 1, wherein the transmit reconfigurable-metasurface includes a plurality of dynamically adjustable high-Q dielectric resonators arranged on the surface with inter-element spacing less than an operating wavelength of the laser.

10. The system of claim 9, wherein the surface includes a conducting surface, and the plurality of resonators have a corresponding plurality of adjustable reflection phases providing a dynamically adjustable reflected wave responsive to an incident wave.

11. The system of claim 9, wherein the inter-element spacing is less than one-half of the operating wavelength.

12. The system of claim 9, wherein each of the plurality of dielectric resonators includes:
a pair of regions having a high refractive index; and
an electrically-adjustable material disposed in a gap between the regions.

13. The system of claim 12, wherein the regions include semiconductor regions.

14. The system of claim 12, wherein the regions include pillars oriented perpendicular to the surface.

15. The system of claim 9, wherein each of the plurality of resonators further includes:
a pair of electrodes configured to apply an adjustable voltage across the electrically-adjustable material.

16. The system of claim 15, wherein the plurality of resonators are arranged in a one-dimensional array, and each of the resonators further includes:
a first electrode in the pair of electrodes is connected to ground; and
a second electrode in the pair of electrodes is connected to a bias voltage for the resonator.

17. The system of claim 9, wherein the plurality of resonators are arranged in a two-dimensional array indexed by row and column, and each of the resonators further includes:
a matrix circuitry indexed by row and column and connected to the pair of electrodes.

18. The system of claim 1, wherein the selected portion of the field of view includes one selected field-of-view pixel.

19. The system of claim 1, wherein the selected portion of the field of view includes a selected 1×4 field-of-view pixels.

20. The system of claim 1, wherein the selected portion of the field of view includes a selected 2×2 field-of-view pixels.

21. The system of claim 1, wherein the first selected holographic beam steering pattern is implemented in the transmit reconfigurable-metasurface in response to a first control signal.

22. The system of claim 1, wherein the first transmit reconfigurable-metasurface is reconfigurable in one-dimension.

23. The system of claim 1, wherein the first transmit reconfigurable-metasurface is reconfigurable in two-dimensions.

24. The system of claim 1, wherein the receive reconfigurable-metasurface includes a dynamically reconfigurable-metasurface.

25. The system of claim 1, wherein the receive reconfigurable-metasurface includes a one-dimensional reconfigurable-metasurface.

26. The system of claim 1, wherein the receive reconfigurable-metasurface includes a two-dimensional reconfigurable-metasurface.

27. The system of claim 1, wherein the receive reconfigurable-metasurface includes a plurality of dynamically adjustable high-Q dielectric resonators arranged on a surface with inter-element spacing less than an optical operating wavelength of the laser.

28. The system of claim 1, wherein the receive reconfigurable-metasurface includes a two dimensional field of view.

29. The system of claim 1, wherein the receive reconfigurable-metasurface is configured to implement a specified beam steering hologram defined by a one-dimensional radiation pattern established in the receive reconfigurable-metasurface in response to a second control signal.

30. The system of claim 1, wherein the array of detector pixels includes one or more detector pixels.

31. The system of claim 1, wherein the array of detector pixels includes a 2×2 array of detector pixels.

32. The system of claim 1, wherein the timing circuit of a pixel includes a timing circuit configured to determine a time of flight between a transmission of the pulse of light and a detection of the light of the return of the illumination beam.

33. The system of claim 1, further comprising:
a scanning engine configured to implement a scan of the field of view by stepping the transmitted beam of the pulsed light over at least a portion of the field of view, the implementation including selecting for each pulse of light to be reflected by the transmit reconfigurable-metasurface (i) a first holographic beam steering pattern to be implemented in the transmit reconfigurable-metasurface and (ii) a second holographic beam steering pattern to be implemented in the receive reconfigurable-metasurface.

34. The system of claim 33, wherein the scanning engine is configured to control a scan of the field of view at a first resolution.

35. The system of claim 34, wherein the scanning engine is configured to control a scan of the field of view at a second resolution, the second resolution selected by the scanning engine in response to the outputted detection signal from the scan at the first resolution.

36. The system of claim 33, wherein the scanning engine includes:
a metasurface controller circuit configured to implement the selected first holographic beam steering pattern using a first control signal and the selected second holographic beam steering pattern using a second control signal.

37. The system of claim 33, wherein the scanning engine includes:

a hologram selector circuit configured to select (i) a first holographic beam steering pattern configured to reflect the light pulse as the illumination beam pointing at the selected portion of a field of view and (ii) a second holographic beam steering pattern configured to reflect the return of the illumination beam as the relay beam pointing at the optical detector.

38. The system of claim 33, wherein the scanning engine includes a region of interest selector circuit, the region of interest selector circuit configured to:
recognize a pattern in a first outputted detection signal produced by a first scan of the field of view at a first resolution; and
select in response to the recognized pattern a region of interest in the field of view for a second scan at a second resolution higher than the first resolution.

39. The system of claim 1, further comprising:
a data computation circuit configured to generate three-dimensional data indicative of at least a portion of the field of view in response to the outputted detection signal.

40. A LIDAR scanning system comprising:
a laser configured to emit pulses of light at an operating wavelength;
a transmit reconfigurable-metasurface configured to reflect an incident pulse of light from the laser as an illumination beam pointing at a selected portion of a field of view, the pointing of the illumination beam responsive to a first selected holographic beam steering pattern implemented in the transmit reconfigurable-metasurface;
a receive reconfigurable-metasurface configured to reflect a return of the illumination beam from the selected portion of the field of view as a relay beam pointing at an optical detector, the pointing of the relay beam responsive to a second selected holographic beam steering pattern implemented in the receiving reconfigurable-metasurface;
the optical detector comprising an array of detector pixels, each detector pixel including (i) a photodetector configured to detect light in the return of the illumination beam and (ii) a timing circuit configured to determine a time of flight of the detected light, the optical detector also configured to output a detection signal indicative of the detected light and a time of flight of the detected light for each pixel of the array;
a scanning engine configured to implement a scan of the field of view by stepping the transmitted beam of the pulsed light over at least a portion of the field of view, the implementation including selecting for each pulse of light to be reflected by the transmit reconfigurable-metasurface (i) a first holographic beam steering pattern to be implemented in the transmit reconfigurable-metasurface and (ii) a second holographic beam steering pattern to be implemented in the receive reconfigurable-metasurface.

* * * * *